(12) United States Patent
MacGillivray et al.

(10) Patent No.: US 7,524,373 B2
(45) Date of Patent: Apr. 28, 2009

(54) APPARATUS AND SEMICONDUCTOR CO-CRYSTAL

(75) Inventors: Leonard R. MacGillivray, Iowa City, IA (US); Anatoliy N. Sokolov, Iowa City, IA (US)

(73) Assignee: University of Iowa Research Foundation, Iowa City, IA (US)

( * ) Notice: Subject to any disclaimer, the term of this patent is extended or adjusted under 35 U.S.C. 154(b) by 154 days.

(21) Appl. No.: 11/343,082

(22) Filed: Jan. 30, 2006

(65) Prior Publication Data

US 2007/0178621 A1 Aug. 2, 2007

(51) Int. Cl.
*C30B 29/54* (2006.01)

(52) U.S. Cl. .................... 117/95; 117/96; 117/104; 117/929

(58) Field of Classification Search ............. 117/95, 117/96, 104, 929
See application file for complete search history.

(56) References Cited

U.S. PATENT DOCUMENTS

2006/0033086 A1* 2/2006 Gerlach .............. 252/500
2007/0194302 A1* 8/2007 Inoue et al. .............. 257/40

OTHER PUBLICATIONS

Bendikov, Michael et al., Tetrathiafulvalenes, Oligoacenenes, and Their Buckminsterfullerene Derivatives: The Brick and Mortar of Organic Electrronics, *Chem. Rev.*, vol. 104, 4891-4945, 2004.

Bredas, J. L. et al., Organic semiconductors: A theoretical characterization of the basic parameters governing charge transport, *PNAS*, vol. 99, No. 9, 5804-5809, 2002.

Krische, Michael J., et al., Self-assembly of 1- and 2-Dimensional Multicompartmental Arrays via teh 2-Aminopyrimidine H-Bonding Motif and Selective Guest Inclusion, *Tetrahedron,*, vol. 56, 6701-6706, 2000, Elsevier Science Ltd.

Newman, Christopher R., Introduction to Organic Thin Film Transistors and Design of n-Channel Organic Semiconductors, *Chem. Mater.*, vol. 16, 4436-4451, American Cheical Society, 2004.

Payne, Marcia M., et al., Organic Field-Effect Transistors from Solution-Deposited Functionalized Acenes with Mobilities as High as 1 $cm^2N$-s, *J. Am. Chem. Soc.*, vol. 127, 4986-4987, 2005, American Chemical Society.

Sheraw, Chris et al., Functionalized Pentacene Active Layer Organic Thin-Film Transistors, *Adv. Mat.*, vol. 15, No. 23, 2003.

Sokolov, Anatoliy et al., Enforced Face-to-Face Stacking of Organic Semiconductor Building Blocks within Hydrogen-Bonded Molecular Co-Crystals, *J. Am. Chem. Soc.*, vol. 128, No. 9, 2806-2807, 2006.

* cited by examiner

*Primary Examiner*—Robert M Kunemund
(74) *Attorney, Agent, or Firm*—Viksnins, Harris & Padys PLLP

(57) ABSTRACT

The invention provides a method to enforce face-to-face stacking of organic semiconductors in the solid state that employs semiconductor co-crystal formers (SCCFs), to align semiconductor building blocks (SBBs). Single-crystal X-ray analysis reveals n-orbital overlap optimal for organic semiconductor device applications.

3 Claims, 10 Drawing Sheets

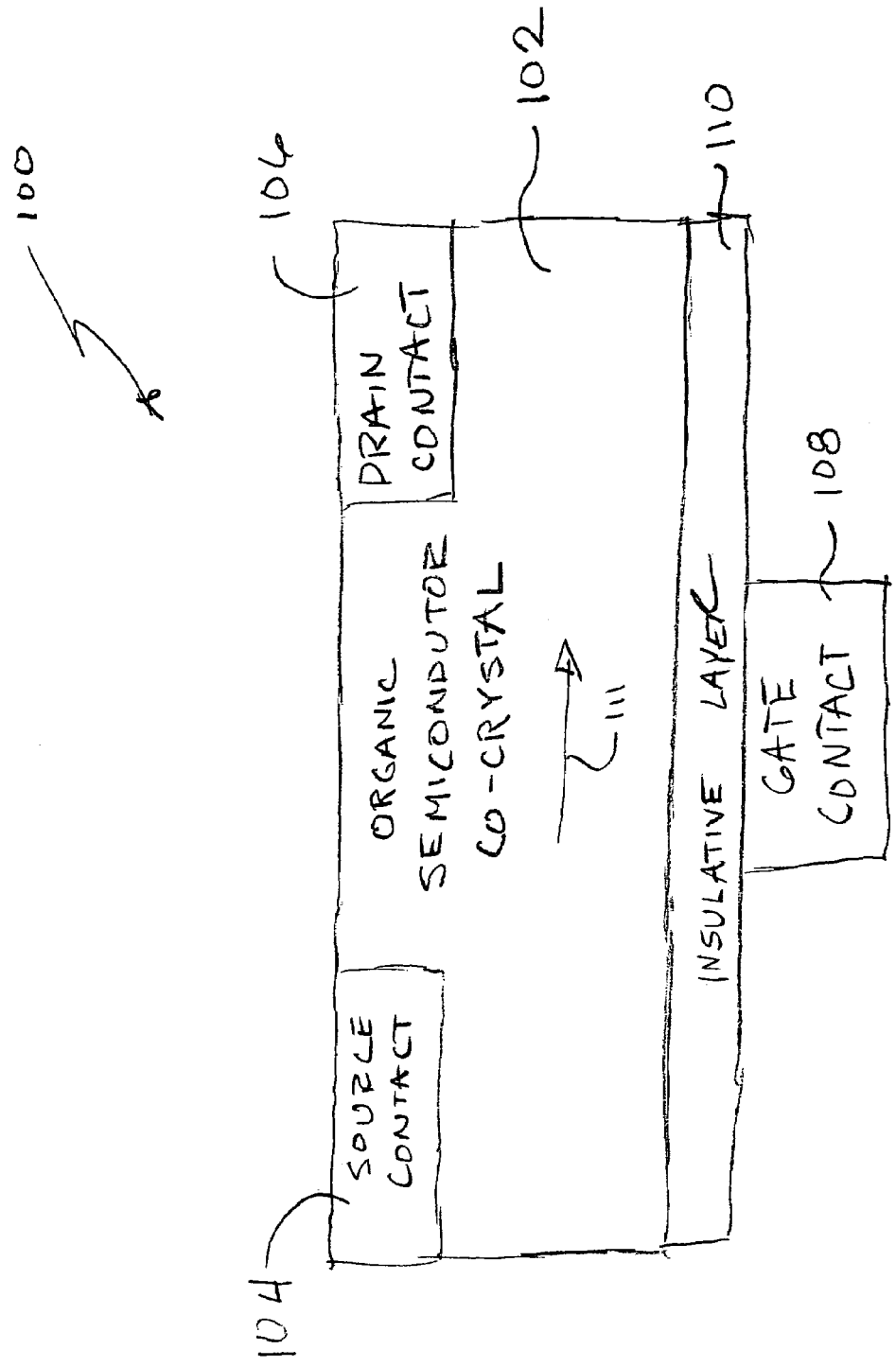

APPARATUS AND SEMICONDUCTOR CO-CRYSTAL

BACKGROUND OF THE INVENTION

Organic field-effect transistors (OFETs) have garnered widespread attention as devices where low material weight and flexibility are critical factors. The construction of such devices has involved organic semiconductor molecules based on polyacenes and oligothiophenes, as well as their hybrids. See Payne, M. M. et al., *J. Am. Chem. Soc.* 2005, 127, 4986-4987; Meng, H.; et al., *J. Am. Chem. Soc.* 2005, 127, 2406-2407; and Fichou, D. *J. Mater. Chem.* 2000, 10, 571-588. The majority of efforts to design and affect the performance of OFETs have focused on strategies to control solid-state structure. Many reports have underscored the importance of extended face-to-face stacking with short intermolecular separations that maximize p-orbital overlap. See Garnier, F. *Syn. Met.* 1996, 81, 163-171; Facchetti, F., et al., *J. Am. Chem. Soc.* 2004, 126, 13480-13501; Wu, Y., et al., and *Appl. Phys. Lett.* 2005, 86, 142102(1-3)

In this context, synthetic efforts to promote face-to-face solid-state stacking have focused on the functionalization of semiconductor molecules (e.g. pentacene, oligothiophene) with groups intended to direct the assembly process to the prerequisite packing. See Turbiez, M., et al., *J. Chem. Eur. J.* 2005, 11, 3742-3752; Moon, H., et al., *J. Am. Chem. Soc.* 2004, 126, 15322-15323; and Meng, H., et al., *Adv. Mater.* 2003, 15, 1090-1093. The intermolecular forces used to promote such arrangements have thus far been relatively weak, being based on van der Waals and/or dipole-dipole interactions. The most successful implementation of this strategy has, arguably, involved pentacene, where steric effects provided by bulky substituents prevented C-H . . . p forces. See Anthony, J. E., et al., *Org. Lett.* 2002, 4, 15-18; Sheraw, C. D, et al., *Adv. Mat.* 2003, 15, 2009-2011; and MacGillivray, L. R. *CrystEngComm,* 2004, 6, 77-78. A much greater p-orbital overlap was achieved, along with a lower anisotropic resistance perpendicular to the ring system (see Anthony, J. E., et al., *J. Am. Chem. Soc.* 2001, 123, 9482-9483), as compared to pure pentacene. However, the amount of p-orbital overlap cannot be correlated to the size and position of the functional groups, owing to a difficulty to control slipping along the pentacene short axis. See Anthony, J. E., et al., *Org. Lett.* 2002, 4, 15-18; Sheraw, C. D, et al., *Adv. Mat.* 2003, 15, 2009-2011; and MacGillivray, L. R. *CrystEngComm,* 2004, 6, 77-78. At the same time, reports have suggested a need to incorporate relatively strong intermolecular forces within such semiconductor lattices in order to suppress charge carrier scattering by lattice vibrations (See Dimitrakopoulos, C. D.; Malenfant, P. R. L. *Adv. Mat.* 2002, 14, 99-117. Collectively, these observations attest to the sensitivity of crystal packing to changes to molecular structure and create a challenge to devise methods that employ stronger intermolecular forces that control face-to-face stacking as a means to optimize the performances of organic semiconductor solids.

Currently there is a need for organic semi-conducting materials. Such materials will be useful, for example, in electrical devices, such as organic field-effect transistors, display devices, computer chips, plastic paper, and smart cards.

SUMMARY OF THE INVENTION

The invention provides organic semiconducting co-crystals, as well as devices comprising such co-crystals, and intermediates and processes useful for preparing such materials.

In one embodiment the invention provides an apparatus comprising: an organic semiconductor co-crystal including a source contact coupled to the organic semiconductor co-crystal, a drain contact coupled to the organic semiconductor co-crystal, and a gate contact coupled to the organic semiconductor co-crystal through an insulative layer.

In another embodiment the invention provides an apparatus comprising: an electronic circuit; and an organic semiconductor co-crystal switch coupled to the electronic circuit.

In another embodiment the invention provides a method comprising: forming a thin film including an organic semiconductor co-crystal on a substrate; and forming an active electronic device in the organic semiconductor co-crystal.

In another embodiment the invention provides an apparatus comprising: a first electronic device; a second electronic device; and an organic semiconductor co-crystal to couple the first electronic device to the second electronic device.

In another embodiment the invention provides a method for preparing a semiconducting organic co-crystal material comprising allowing the semiconducting organic co-crystal material to form from a mixture of one or more semiconductor co-crystal formers and one or more semiconductor building blocks In another embodiment the invention provides a semiconducting co-crystal material prepared by a method described herein.

In another embodiment the invention provides a semiconducting co-crystal material comprising semiconductor building blocks associated with semiconductor co-crystal formers.

In another embodiment the invention provides an apparatus comprising: an organic semiconductor co-crystal as described herein including a source contact coupled to the organic semiconductor co-crystal, a drain contact coupled to the organic semiconductor co-crystal, and a gate contact coupled to the organic semiconductor co-crystal through an insulative layer.

In another embodiment the invention provides an apparatus comprising: an electronic circuit; and a switch comprising an organic semiconductor co-crystal as described herein coupled to the electronic circuit.

In another embodiment the invention provides a method comprising: forming a thin film including an organic semiconductor co-crystal as described herein on a substrate; and forming an active electronic device in the organic semiconductor co-crystal.

In another embodiment the invention provides an apparatus comprising: a first electronic device; a second electronic device; and an organic semiconductor co-crystal as described herein to couple to the first electronic device to the second electronic device.

BRIEF DESCRIPTION OF THE FIGURES

FIG. 1A is a block diagram of an apparatus including an organic semiconductor co-crystal having a source contact coupled to the organic semiconductor co-crystal, a drain contact coupled to the organic semiconductor co-crystal, and a gate contact coupled to the organic semiconductor co-crystal through an insulative layer.

DETAILED DESCRIPTION

Figure 5:
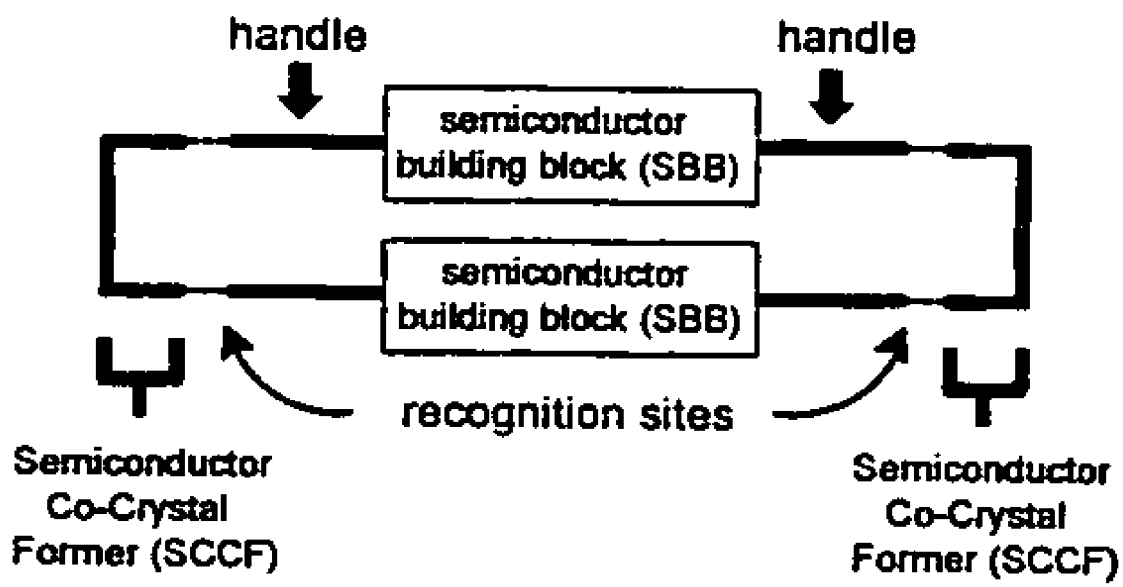
FIG. 5 is a schematic of non-covalent enforcement of face-to-face stacking of semi-conductor building blocks.

A new approach has been discovered to control the organization of semiconductor molecules in the solid state, which enforces face-to-face p-stacking using the strength and directionality of molecular associations, such as, ionic bonds, or other non-covalent bonds (e.g. dipole-dipole interactions, hydrogen bonds, van der Waals interactions, or coordination. This approach involves co-crystallizing (for co-crystals in the context of conductive organic solids, see: Thomas, G. A.; Schafer, D. E.; Wudl, F.; Horn, P. M.; Rimai, D.; Cook, J. W.; Glocker, D. A.; Skove, M. J.; Chu, C. *W. Phys. Rev. B.* 1976, 13, 5105-5110) a polyfunctional (e.g. a bifunctional) molecule, hereafter referred to as a semiconductor co-crystal former (SCCF), with a semiconductor building block (SBB) functionalized with an appropriate recognition site, or "handle" (FIG. 5). The SCCF thus employs non-covalent molecular associations (e.g. hydrogen bonds) to segregate the structure of the SBB from effects of crystal packing and to enforce p-orbital overlap (see MacGillivray, L. R.; Reid, J. L.; Ripmeester, J. A. *J. Am. Chem. Soc.* 2000, 122, 7817-7818).

Semiconductor Co-Crystal Formers (SCCFs)

Semiconductor co-crystal formers can be used to construct organic semicondicting co-crystals. For example, the semiconductor co-crystal formers can operate by positioning two or more semiconductor building blocks such that there is appropriate orbital overlap to provide a semiconducting solid. By using the organized, solvent-free environment of the solid state, the effects of entropy and solvent can be circumvented.

The semiconductor co-crystal formers can be any inorganic molecule (e.g. a transition metal complex), organic molecule (e.g. a polyol, a poly-ether, or a polyamine), solid support, or assembly of inorganic and/or organic molecules or ions held together by non-covalent bonds (e.g. a coordination complex) that is capable of associating with the semiconductor building blocks so that the π-orbitals of the semiconductor building blocks overlap properly to provide a semiconducting material. In one embodiment the semiconductor co-crystal former comprises an aromatic ring. In another embodiment the semiconductor co-crystal former comprises an aromatic ring that is 1,3 substituted with groups capable of associating with the semiconductor building blocks polyene molecules (e.g. a 1,3-substituted phenyl ring or a 1,3-substituted naphthyl ring). In another embodiment the semiconductor co-crystal former comprises a 1,3-dihydroxy substituted phenyl ring or a 1,3-dihydroxy substituted naphthyl ring In a specific embodiment the semiconductor co-crystal former is resorcinol (1,3-dihydroxybenzene) or a substituted resorcinol. For example, the template can be resorcinol substituted with one or more (e.g. 1, 2, or 3) ($C_1$-$C_6$)alkyl, ($C_2$-$C_6$)alkenyl, ($C_2$-$C_6$)alkynyl, ($C_1$-$C_6$)alkoxy, ($C_3$-$C_6$)cycloalkyl, ($C_1$-$C_6$)alkanoyl, ($C_1$-$C_6$)alkanoyloxy, ($C_1$-$C_6$)alkoxycarbonyl, cyano, halo, hydroxy, nitro, carboxy, trifluoromethyl, trifluoromethoxy, methylenedioxy, aryl, heteroaryl, aryl($C_1$-$C_6$)alkyl, heteroaryl($C_1$-$C_6$)alkyl, aryl($C_1$-$C_6$)alkanoyl, heteroaryl($C_1$-$C_6$)alkanoyl, or NRR, wherein each R is independently ($C_1$-$C_6$)alkyl, ($C_2$-$C_6$)alkenyl, ($C_2$-$C_6$)alkynyl, ($C_1$-$C_6$)alkoxy, ($C_3$-$C_6$)cycloalkyl, ($C_1$-$C_6$)alkanoyl, ($C_1$-$C_6$)alkanoyloxy, ($C_1$-$C_6$)alkoxycarbonyl, and wherein each aryl or heteroaryl is optionally substituted with one or more (e.g. 1, 2, 3, or 4) ($C_1$-$C_6$)alkyl, ($C_2$-$C_6$)alkenyl, ($C_2$-$C_6$)alkynyl, ($C_1$-$C_6$)alkoxy, ($C_3$-$C_6$)cycloalkyl, ($C_1$-$C_6$)alkanoyl, ($C_1$-$C_6$)alkanoyloxy, ($C_1$-$C_6$)alkoxycarbonyl, cyano, halo, nitro, carboxy, trifluoromethyl, trifluoromethoxy, methylenedioxy, or NRR.

In another specific embodiment the semiconductor co-crystal former is an amino-phenol (e.g. 3-aminophenol) or an amino-hydroxynaphthylene (e.g. 3-amino-1-hydroxynaphthylene or 4-amino-2-hydroxynaphthylene; wherein the phenol or naphthylene ring is optionally substituted with one or more (e.g. 1, 2, or 3) ($C_1$-$C_6$)alkyl, ($C_2$-$C_6$)alkenyl, ($C_2$-$C_6$)alkynyl, ($C_1$-$C_6$)alkoxy, ($C_3$-$C_6$)cycloalkyl, ($C_1$-$C_6$)alkanoyl, ($C_1$-$C_6$)alkanoyloxy, ($C_1$-$C_6$)alkoxycarbonyl, cyano, halo, hydroxy, nitro, carboxy, trifluoromethyl, trifluoromethoxy, methylenedioxy, aryl, heteroaryl, aryl($C_1$-$C_6$)alkyl, heteroaryl($C_1$-$C_6$)alkyl, aryl($C_1$-$C_6$)alkanoyl, heteroaryl($C_1$-$C_6$)alkanoyl, or NRR, wherein each R is independently ($C_1$-$C_6$)alkyl, ($C_2$-$C_6$)alkenyl, ($C_2$-$C_6$)alkynyl, ($C_1$-$C_6$)alkoxy, ($C_3$-$C_6$)cycloalkyl, ($C_1$-$C_6$)alkanoyl, ($C_1$-$C_6$)alkanoyloxy, ($C_1$-$C_6$)alkoxycarbonyl, and wherein each aryl or heteroaryl is optionally substituted with one or more (e.g. 1, 2, 3, or 4) ($C_1$-$C_6$)alkyl, ($C_2$-$C_6$)alkenyl, ($C_2$-$C_6$)alkynyl, ($C_1$-$C_6$)alkoxy, ($C_3$-$C_6$)cycloalkyl, ($C_1$-$C_6$)alkanoyl, ($C_1$-$C_6$)alkanoyloxy, ($C_1$-$C_6$)alkoxycarbonyl, cyano, halo, nitro, carboxy, trifluoromethyl, trifluoromethoxy, methylenedioxy, or NRR.

In another specific embodiment the semiconductor co-crystal former is an aminoaniline (e.g. 3-aminoaniline) or a diaminonaphthylene (e.g. 1,3-diaminonaphthylene or 2,4-diaminonaphthylene; wherein the phenyl or naphthylene ring is optionally substituted with one or more (e.g. 1, 2, or 3) ($C_1$-$C_6$)alkyl, ($C_2$-$C_6$)alkenyl, ($C_2$-$C_6$)alkynyl, ($C_1$-$C_6$)alkoxy, ($C_3$-$C_6$)cycloalkyl, ($C_1$-$C_6$)alkanoyl, ($C_1$-$C_6$)alkanoyloxy, ($C_1$-$C_6$)alkoxycarbonyl, cyano, halo, hydroxy, nitro, carboxy, trifluoromethyl, trifluoromethoxy, methylenedioxy, aryl, heteroaryl, aryl($C_1$-$C_6$)alkyl, heteroaryl($C_1$-$C_6$)alkyl, aryl($C_1$-$C_6$)alkanoyl, heteroaryl($C_1$-$C_6$)alkanoyl, or NRR, wherein each R is independently ($C_1$-$C_6$)alkyl, ($C_2$-$C_6$)alkenyl, ($C_2$-$C_6$)alkynyl, ($C_1$-$C_6$)alkoxy, ($C_3$-$C_6$)cycloalkyl, ($C_1$-$C_6$)alkanoyl, ($C_1$-$C_6$)alkanoyloxy, ($C_1$-$C_6$)alkoxycarbonyl, and wherein each aryl or heteroaryl is optionally substituted with one or more (e.g. 1, 2, 3, or 4) ($C_1$-$C_6$)alkyl, ($C_2$-$C_6$)alkenyl, ($C_2$-$C_6$)alkynyl, ($C_1$-$C_6$)alkoxy, ($C_3$-$C_6$)cycloalkyl, ($C_1$-$C_6$)alkanoyl, ($C_1$-$C_6$)alkanoyloxy, ($C_1$-$C_6$)alkoxycarbonyl, cyano, halo, nitro, carboxy, trifluoromethyl, trifluoromethoxy, methylenedioxy, or NRR.

In another embodiment, the semiconductor co-crystal former can comprise an association of metal ions. Certain metal ions (e.g. metal cations) are known to be attracted to each other by forces that are weaker than most covalent or ionic bonds but stronger than van der Waals bonds. See for example P. Pyykko, *Chem Rev.,* 1997, 97, 597-636. Such metal ion assemblies can operate as semiconductor co-crystal formers. In one specific embodiment of the invention, the semiconductor co-crystal former comprises an assembly of two or more metal cations. In another specific embodiment the semiconductor co-crystal former comprises an assembly of two or more transition metal cations. In another specific embodiment the semiconductor co-crystal former comprises an assembly of two or more silver or gold ions. It will be appreciated that such poly metal cation assemblies will also comprise suitable counter ions. The nature of the counter ions is not critical provided the resulting assembly is capable of orienting the SBBs. For example, the counter ions may be carboxylates, (e.g. acetates and triflates), sulfonates, or halides, or mixtures thereof. The SBBs can associate with the metal ions of the metal cation assemblies by ionic bonds, or other non-covalent bonds (e.g. dipole-dipole interactions, hydrogen bonds, van der Waals interactions, or coordination)

The following definitions are used, unless otherwise described: halo is fluoro, chloro, bromo, or iodo. Alkyl, alkoxy, alkenyl, alkynyl, etc. denote both straight and branched groups; but reference to an individual radical such as propyl embraces only the straight chain radical, a branched chain isomer such as isopropyl being specifically referred to. Aryl denotes a phenyl radical or an ortho-fused bicyclic carbocyclic radical having about nine to ten ring atoms in which at least one ring is aromatic. Heteroaryl encompasses a radical attached via a ring carbon of a monocyclic aromatic ring containing five or six ring atoms consisting of carbon and one to four heteroatoms each selected from the group consisting of non-peroxide oxygen, sulfur, and N(X) wherein X is absent or is H, O, $(C_1-C_4)$alkyl, phenyl or benzyl, as well as a radical of an ortho-fused bicyclic heterocycle of about eight to ten ring atoms derived therefrom, particularly a benz-derivative or one derived by fusing a propylene, trimethylene, or tetramethylene diradical thereto. The term "alkene" includes compounds having one or more carbon-carbon double bonds. In one specific embodiment of the invention, "alkene" is a compound having a chain of atoms that includes one carbon-carbon double bond.

Specific values listed below for radicals, substituents, and ranges, are for illustration only; they do not exclude other defined values or other values within defined ranges for the radicals and substituents.

Specifically, $(C_1-C_6)$alkyl can be methyl, ethyl, propyl, isopropyl, butyl, iso-butyl, sec-butyl, pentyl, 3-pentyl, or hexyl; $(C_3-C_6)$cycloalkyl can be cyclopropyl, cyclobutyl, cyclopentyl, or cyclohexyl; $(C_1-C_6)$alkoxy can be methoxy, ethoxy, propoxy, isopropoxy, butoxy, iso-butoxy, sec-butoxy, pentoxy, 3-pentoxy, or hexyloxy; $(C_2-C_6)$alkenyl can be vinyl, allyl, 1-propenyl, 2-propenyl, 1-butenyl, 2-butenyl, 3-butenyl, 1-pentenyl, 2-pentenyl, 3-pentenyl, 4-pentenyl, 1-hexenyl, 2-hexenyl, 3-hexenyl, 4-hexenyl, or 5-hexenyl; $(C_2-C_6)$alkynyl can be ethynyl, 1-propynyl, 2-propynyl, 1-butynyl, 2-butynyl, 3-butynyl, 1-pentynyl, 2-pentynyl, 3-pentynyl, 4-pentynyl, 1-hexynyl, 2-hexynyl, 3-hexynyl, 4-hexynyl, or 5-hexynyl; $(C_1-C_6)$alkanoyl can be acetyl, propanoyl or butanoyl; $(C_1-C_6)$alkoxycarbonyl can be methoxycarbonyl, ethoxycarbonyl, propoxycarbonyl, isopropoxycarbonyl, butoxycarbonyl, pentoxycarbonyl, or hexyloxycarbonyl; $(C_2-C_6)$alkanoyloxy can be acetoxy, propanoyloxy, butanoyloxy, isobutanoyloxy, pentanoyloxy, or hexanoyloxy; aryl can be phenyl, indenyl, or naphthyl; and heteroaryl can be furyl, imidazolyl, triazolyl, triazinyl, oxazoyl, isoxazoyl, thiazolyl, isothiazolyl, pyrazolyl, pyrrolyl, pyrazinyl, tetrazolyl, pyridyl, (or its N-oxide), thienyl, pyrimidinyl (or its N-oxide), indolyl, isoquinolyl (or its N-oxide) or quinolyl (or its N-oxide).

A specific resorcinol that can be used as a semiconductor co-crystal former is resorcinol, orcinol [5-methylresorcinol], 4-ethylresorcinol, 4-hexylresorcinol, olivetol [5-pentylresorcinol], 4-cyclohexylresorcinol, 4-benzylresorcinol, 4-chlororesorcinol, 4-bromoresorcinol, 4,6-dichlororesorcinol, 4,6-dibromoresorcinol, 4,6-di-tert-butylresorcinol, 4,6-di-(1,1-diphenylethyl)resorcinol, 3,5-dihydroxybenzaldehyde, 5-cyanoresorcinol, 5-acetylresorcinol, 5-methoxyresorcinol, 5-carboxymethylresorcinol, 1,3-dihydroxynaphthalene, 4,6-dibromo-5-carboxymethylresorcinol, 2,4,6-trihydroxybenzaldehyde (phloroglucinaldehyde), methyl 2,4-6-trihydroxyphenyl ketone, ethyl 2,4-6-trihydroxyphenyl ketone, propyl 2,4-6-trihydroxyphenyl ketone, butyl 2,4-6-trihydroxyphenyl ketone, pentyl 2,4-6-trihydroxyphenyl ketone, hexyl 2,4-6-trihydroxyphenyl ketone, or phenyl 2,4-6-trihydroxyphenyl ketone.

Association Between Semiconductor Co-Crystal Former and Semiconductor Building Blocks According to the methods of the invention, the SBBs can be "associated" to the semiconductor co-crystal formers by any suitable attractive force, such as, for example, ionic bonds, or other non-covalent bonds (e.g. dipole-dipole interactions, hydrogen bonds, van der Waals interactions, or coordination). The term "associated" does not include covalent bonding.

Semiconductor Building Blocks

Typically the semiconductor building blocks include one or more aromatic ring systems. For example, the semiconductor building blocks can include one or more monocyclic, bicyclic, or polycyclic ring systems wherein at least one ring is aromatic. When a semiconductor building block includes more than one aromatic ring system, the aromatic ring systems can be linked directly by a covalent bond, or the aromatic ring systems can be linked by a straight or branched, saturated or unsaturated, substituted or unsubstituted carbon chain. For example, see the aromatic ring containing structures reported in C. R. Newman et al., *Chem. Mater.*, 2004, 16, 4436-4451 (e.g. the napthalene dimide, and perylene dimide structures NTCDI, NTCDI-R, PTCDI-R, PTCDI-PPEEB, PTCDI-PPE4CN, and tetrachloro PTCDI-R).

The properties of the semi-conducting co-crystals can be modified by selecting semiconductor building blocks with specific highest occupied molecular orbital (HOMO)/lowest unoccupied molecular orbital (LUMO) gaps (see Michael Bendikov and Fred Wudl, *Chem. Rev.*, 2004, 104, 4891-4945). For example, in one embodiment of the invention, molecules with low HOMO/LUMO gaps can be selected due to their ability to easily donate from HOMO or accept an electron on LUMO.

In one embodiment of the invention the semiconductor building block includes one or more aromatic rings selected from phenyl, naphthyl, pyridyl, pentacene, tetracene, anthracene, napthalene dimide, and perylene dimide, and combinations thereof (e.g. the napthalene dimides, and perylene dimides NTCDI, NTCDI-R, PTCDI-R, PTCDI-PPEEB, PTCDI-PPE4CN, and tetrachloro PTCDI-R).

In another embodiment of the invention the semiconductor building block includes an oligothiophene or an oligoacene. Typically the thiophene and acene oligomers comprise from about 2 to about 20 rings or from about 2 to 15 rings.

The aromatic ring systems of the semiconductor building blocks can optionally be substitutes with one or more (e.g. 1, 2, 3, or 4) $(C_1-C_6)$alkyl, $(C_2-C_6)$alkenyl, $(C_2-C_6)$alkynyl, $(C_1-C_6)$alkoxy, $(C_3-C_6)$cycloalkyl, $(C_1-C_6)$alkanoyl, $(C_1-C_6)$alkanoyloxy, $(C_1-C_6)$alkoxycarbonyl, cyano, halo, hydroxy, nitro, carboxy, trifluoromethyl, trifluoromethoxy, methylenedioxy, aryl, heteroaryl, aryl$(C_1-C_6)$alkyl, heteroaryl$(C_1-C_6)$alkyl, aryl$(C_1-C_6)$alkanoyl, heteroaryl$(C_1-C_6)$alkanoyl, or NRR, wherein each R is independently $(C_1-C_6)$alkyl, $(C_2-C_6)$alkenyl, $(C_2-C_6)$alkynyl, $(C_1-C_6)$alkoxy, $(C_3-C_6)$cycloalkyl, $(C_1-C_6)$alkanoyl, $(C_1-C_6)$alkanoyloxy, $(C_1-C_6)$alkoxycarbonyl, and wherein each aryl or heteroaryl is optionally substituted with one or more (e.g. 1, 2, 3, or 4) $(C_1-C_6)$alkyl, $(C_2-C_6)$alkenyl, $(C_2-C_6)$alkynyl, $(C_1-C_6)$alkoxy, $(C_3-C_6)$cycloalkyl, ($C_1$-$C_6$)alkanoyl, ($C_1$-$C_6$)alkanoyloxy, ($C_1$-$C_6$) alkoxycarbonyl, cyano, halo, nitro, carboxy, trifluoromethyl, trifluoromethoxy, methylenedioxy, or NRR.

Typically, the semiconductor building blocks are terminally substituted with a group that is capable of associating with the semiconductor co-crystal former. In one embodiment each terminal group can independently comprises an amino nitrogen, a thiol, an alcohol, or a carboxylic acid. In another embodiment, each semiconductor co-crystal former is terminally substituted with a pyridine ring (e.g. a 4-pyridine ring).

Co-Crystalization

The co-crystalization of the semiconductor co-crystal former and the semiconductor building blocks can be carried out under any conditions that are suitable to allow for the formation of semi-conducting co-crystals. Co-crystallization conditions can include precipitation, solvent evaporation, crystallization from gels, nucleation, and layering. Solvents can include organic solvents such as, but not limited to, acetonitrile, nitromethane, chloroform, dichloromethane, tetrahydrofuran, ethanol, and methanol. Solvent mixtures can be used. The solvent can also be water. Time for co-crystallizations can be on the order of minutes, to hours, to days, to months.

Figures

FIG. 1A is a block diagram of an apparatus 100 including an organic semiconductor co-crystal 102 having a source contact 104 coupled to the organic semiconductor co-crystal 102, a drain contact 106 coupled to the organic semiconductor co-crystal 102, and a gate contact 108 coupled to the organic semiconductor co-crystal 102 through an insulative layer 110. The organic semiconductor co-crystal 102 includes materials as described above. The source contact 104, drain contact 106, and gate contact 108 provide electrical connections to the organic semiconductor co-crystal 102. The conductivity of the source contact 104, the drain contact 106, and the gate contact 108 is a value suitable to deliver electronic signals to the organic semiconductor co-crystal 102. The insulative layer 110 is a substantial insulator in that the conductivity of the insulative layer 110 is less than the conductivity of the organic semiconductor co-crystal 102. Silicon dioxide is an exemplary material suitable for use in connection with the fabrication of the insulative layer 110 in the apparatus 100. The apparatus 100, as shown in FIG. 1A, is configured substantially as a metal-oxide semiconductor field-effect transistor. In operation, a control signal at the gate contact 108 of the apparatus 100 controls a current flow 111 between the source contact 104 and the drain contact 106. The control signal can decrease the flow of current to substantially zero between the source contact 104 and the drain contact 106. Alternatively, the control signal can increase and decrease the flow of current between the source contact 104 and drain contact 106. The increase or decrease can be directly or inversely proportional to the control signal. Therefore, in some embodiments, the apparatus 100 functions as a switch while in other embodiments, the apparatus 100 functions as an amplifier.

Figure 1B:
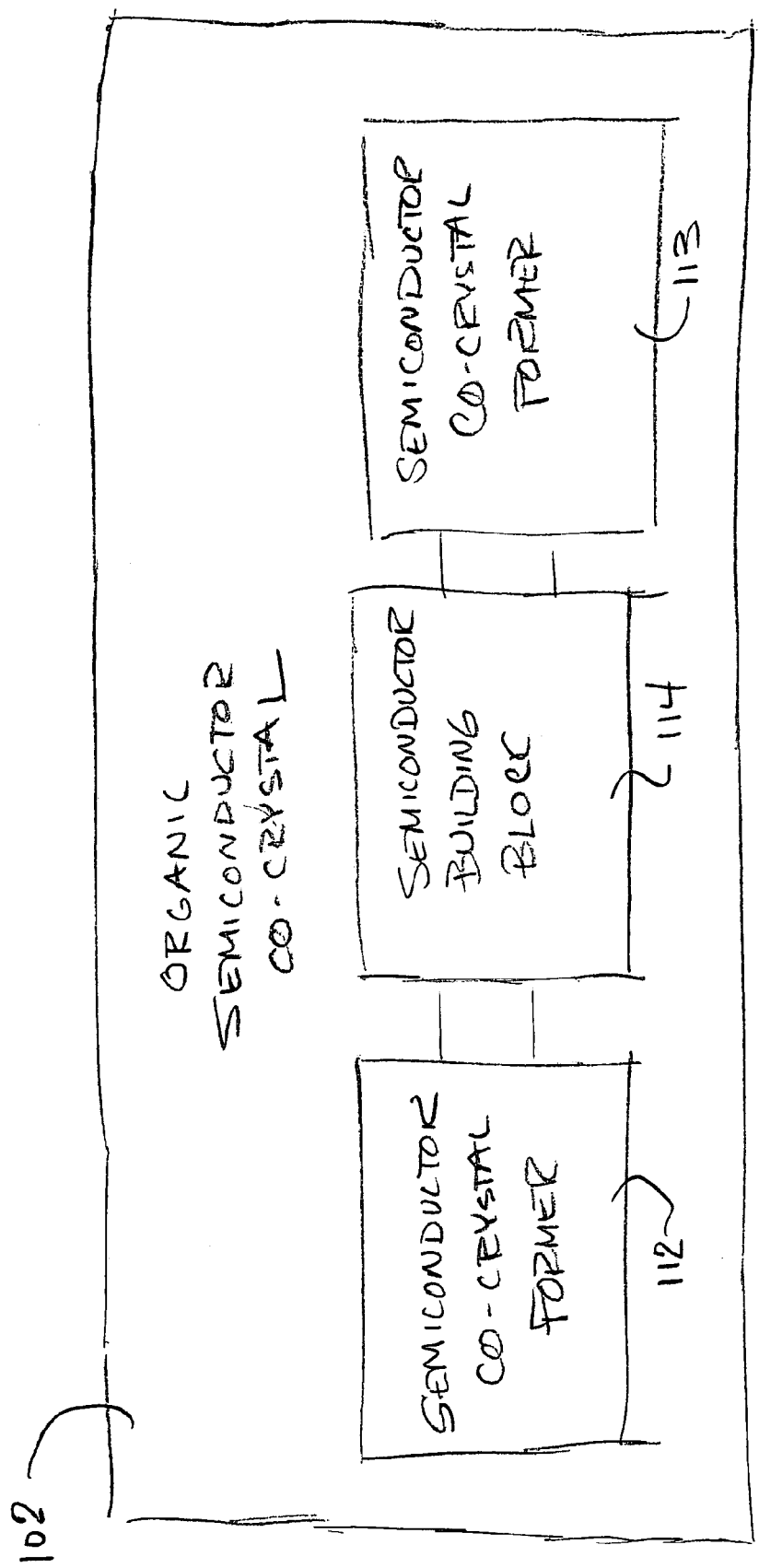
FIG. 1B shows a block diagram of the organic semiconductor co-crystal, shown in FIG. 1A, including a semiconductor co-crystal former coupled to a semiconductor building block.

FIG. 1B shows a block diagram of the organic semiconductor co-crystal 102, shown in FIG. 1A, including semiconductor co-crystal formers 112 and 113 coupled to a semiconductor building block 114. Resorcinols are exemplary materials suitable for use in connection with the fabrication of the semiconductor co-crystal formers 112 and 113. Acenes are exemplary materials suitable for use in connection with the fabrication of the semiconductor building block 114. In some embodiments, pentacene is used in connection with the semiconductor building block 114. In operation, the semiconductor co-crystal formers 112 and 113 provides a template that controls the configuration, as described above, of the semiconductor building block 114.

Figure 2:
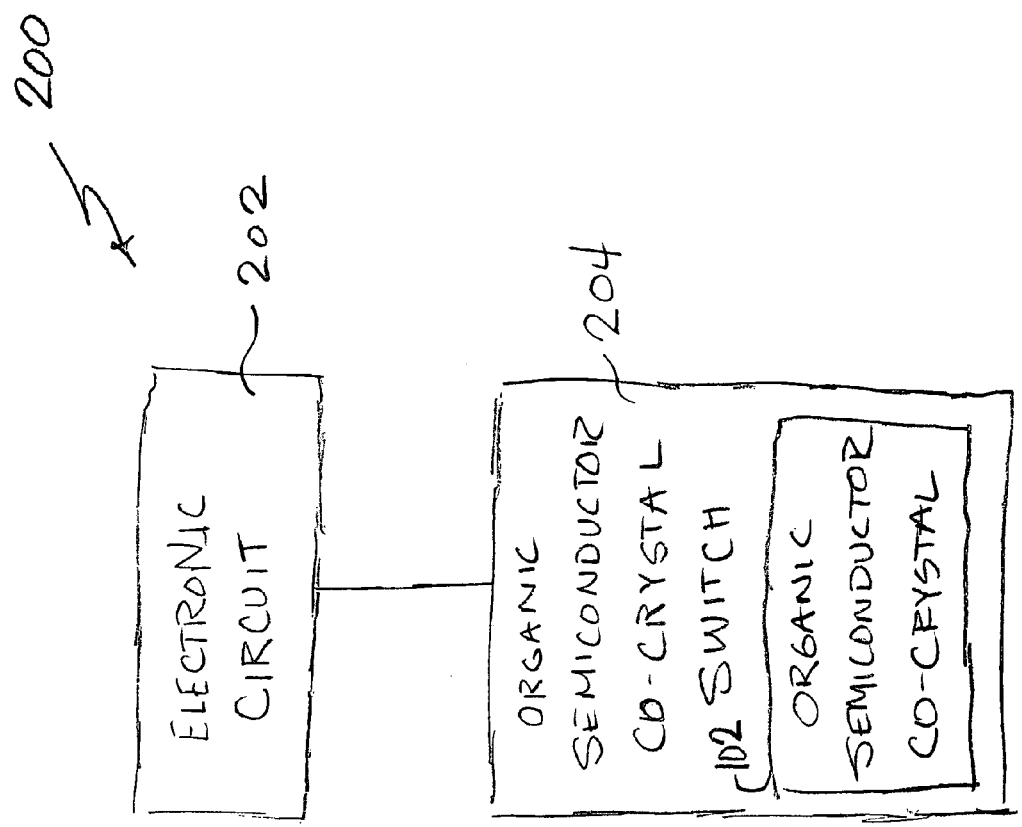
FIG. 2 is a block diagram of an apparatus including an electronic circuit coupled to an organic semiconductor co-crystal switch.

FIG. 2 is a block diagram of an apparatus 200 including an electronic circuit 202 coupled to an organic semiconductor semiconductor co-crystal switch 204. The organic semiconductor co-crystal switch 204 includes the organic co-crystal 102, shown in FIG. 1A, and described above. The electronic circuit 202 is not limited to a particular type of circuit. In some embodiments, the electronic circuit 202 is a digital circuit. In other embodiments, the electronic circuit is an analog circuit. In still other embodiments, the electronic circuit 202 includes both analog and digital circuits. Exemplary materials suitable for use in the fabrication of the organic semiconductor co-crystal switch 204 include acenes and resourcinols.

Figure 3:
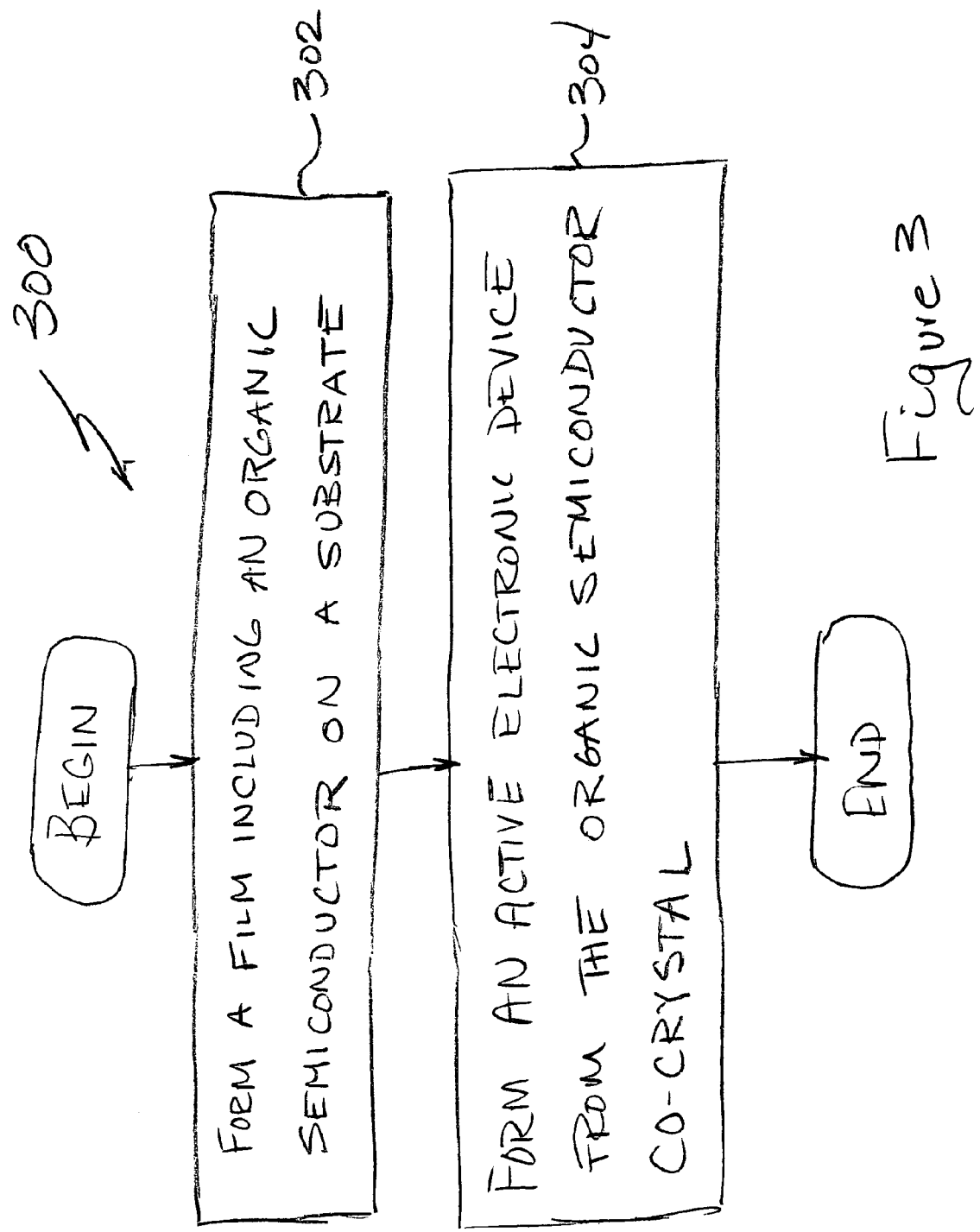
FIG. 3 is a flow diagram of a method including forming a thin film including an organic semiconductor co-crystal on a substrate, and forming an active electronic device in the organic semiconductor co-crystal.

FIG. 3 is a flow diagram of a method 300 including forming a thin film including an organic semiconductor co-crystal on a substrate 302, and forming an active electronic device in the organic semiconductor co-crystal 304. In some embodiments, forming the active electronic device in the organic semiconductor co-crystal includes forming an electronic switch within the organic semiconductor co-crystal. In some embodiments, forming the electronic device in the organic semiconductor co-crystal includes forming an optical device within the organic semiconductor co-crystal.

Figure 4:
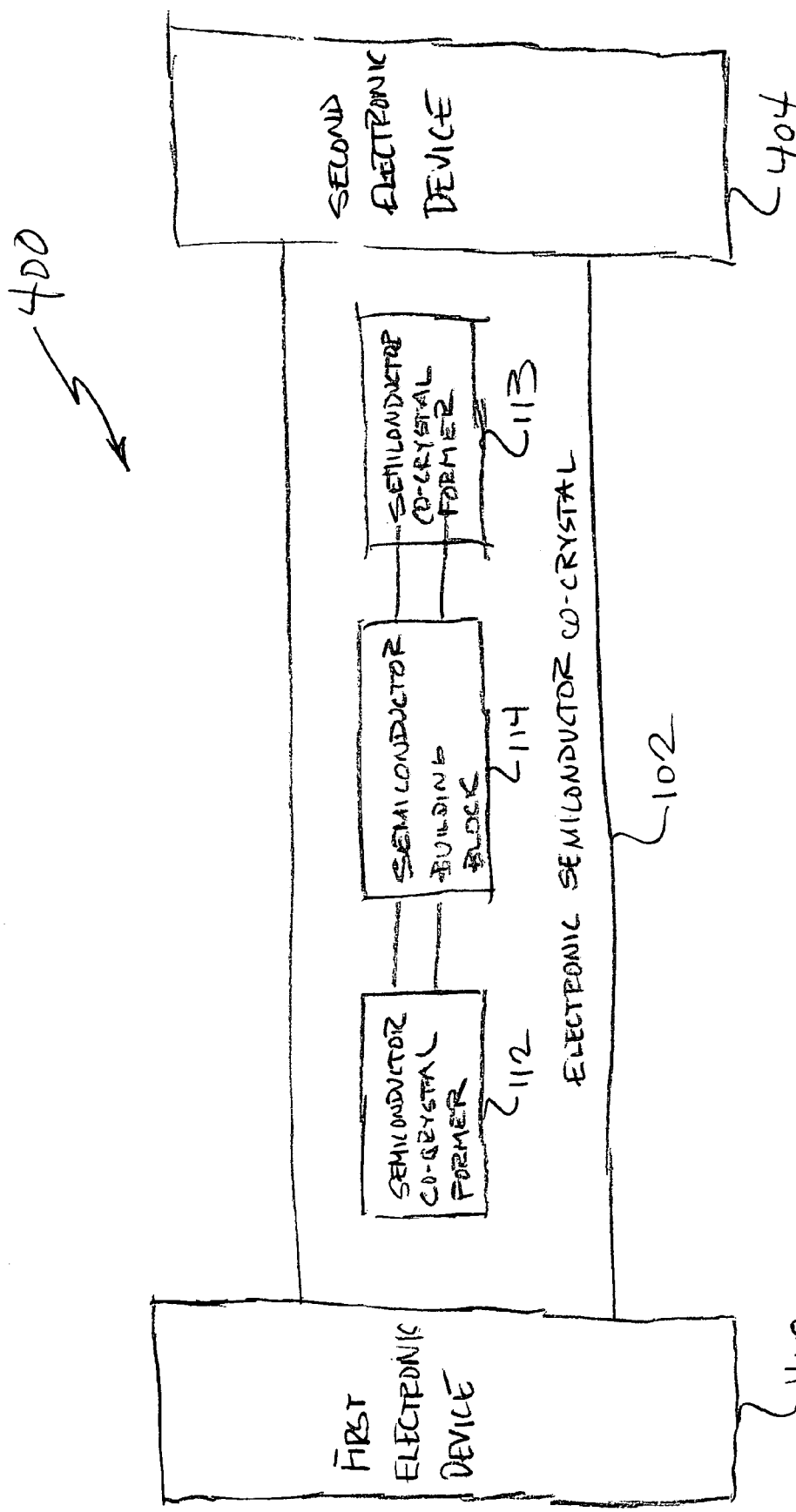
FIG. 4 is a block diagram of an apparatus including a first electronic device, a second electronic device, and an organic semiconductor co-crystal to couple the first electronic device to the second electronic device.

FIG. 4 is a block diagram of an apparatus 400 including a first electronic device 402, a second electronic device 404, and an organic semiconductor co-crystal 102 to couple the first electronic device 402 to the second electronic device 404. The first electronic device 402 and the second electronic device 404 are not limited to particular electronic devices. In some embodiments, the first electronic device 402 and the second electronic device 404 include active electronic devices such as transistors and diodes. In some embodiments, the first electronic device 402 and the second electronic device 404 include electronic systems, such as receivers and transmitters, such as radio-frequency receivers and transmitters, microprocessors, such as reduced instruction set microprocessors, and digital signal processing systems, such as sonar systems. The organic semiconductor co-crystal 102 includes the semiconductor co-crystal formers 112 and 113 coupled to a semiconductor building block 114, shown in FIG. 1B, and described above. In operation, the organic semiconductor co-crystal 102 functions as an electronic interconnect, such as a wire or on board conductive trace, between the first electronic device 402 and the second electronic device 404.

The invention will now be illustrated by the following non-limiting examples.

EXAMPLES

General

SBBs with a minimal number of thiophene and acene rings were investigated since such semiconductor units generally exhibit less p-orbital overlap in the solid state owing to a high number of C—H . . . p forces. See Williams, D. E, Xiao, Y. *Acta Cryst. A*. 1993, 49, 1-10; Desiraju, G. R., Gavezzotti, A., *J. Am. Chem. Soc.* 1989, 621-623; and Tsuzuki, S., et al., *J. Am. Chem. Soc.* 2002, 124, 12200-12209.

Figure 6:
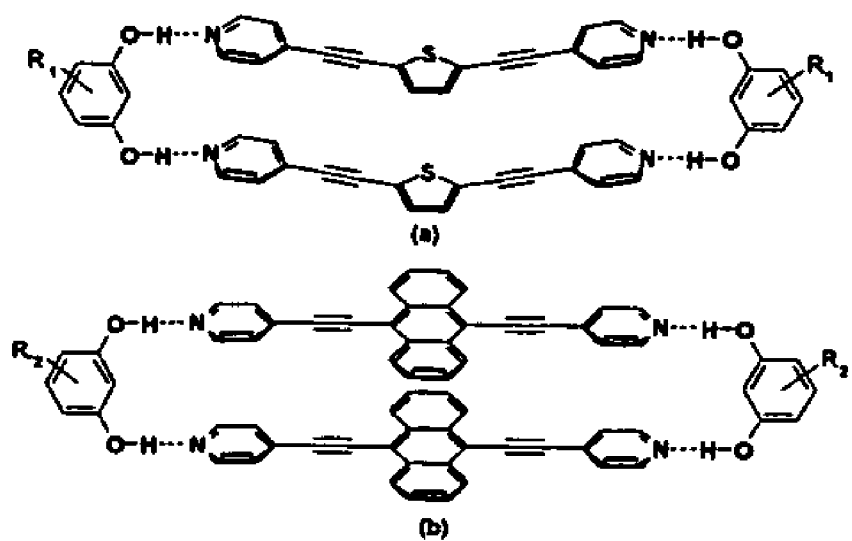
FIG. 6 illustrates (a) (SCCF)·(1) and (b) (SCCF)·(2) ($R_1$=5-methyl-resorcinol; $R_2$=5-iodo-resorcinol).

The SCCF chosen was based on 1,3-dihydroxy benzene, or resorcinol, since it was determined that resorcinol could enforce face-to-face p-stacking of two SBBs based on thiophene and anthracene, namely 2,5-bis(4-pyridylethynyl) thiophene (1) and 9,10-bis(4-pyridylethynyl)anthracene (2) (FIG. 6). The parent SBBs (i.e. thiophene, anthracene) prefer herringbone packing, as demonstrated by experimental and computational studies.

To provide recognition sites for the hydrogen bonds, the SBBs were functionalized with 4-pyridyl-acetylene terminal groups (see Della Ciana, L.; Haim, A.; *J. Heterocyclic Chem.* 1984, 21, 607-608). The formulations of 1 and 2 were confirmed by ¹H NMR spectroscopy and single-crystal X-ray diffraction (see Fasina, M. T., et al., *J. Mat. Chem.* 2004, 14, 2395-2404).

Figure 7:
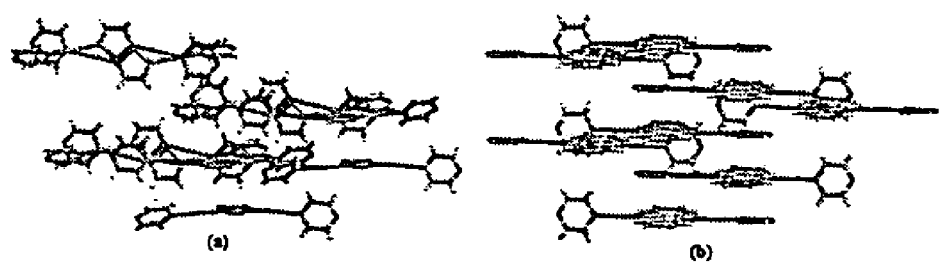
FIG. 7 shows X-ray crystal structures of (a) 1 and (b) 2.

As a control experiment, the crystal structures of functionalized SBBs 1 and 2 (i.e. in the absence of a SCCF) were examined. Whereas the structure of 2 has been recently reported (see Fasina, M. T., et al., *J. Mat. Chem.* 2004, 14, 2395-2404), single crystals of 1 suitable for X-ray diffraction analysis were obtained by slow evaporation of $CH_3CN$. In the case of 1, the solid consists of dimeric assemblies sustained by $C-H_{pyridine} \cdots \pi_{pyridine}$ forces such that the thiophene rings lie approximately antiparallel and offset (FIG. 7). The dimers interact in an offset and parallel manner via $C-H_{thiophene} \cdots N$ forces to form one-dimensional chains along the N-N axis. The dimers of adjacent chains lie approximately perpendicular, being held together by $C-H_{pyridine} \cdots N$ forces. The pyridyl groups of 1 lie twisted out of the plane of the thiophene ring by $38.7(3)°$ and $46.7(2)°$. In the case of 2, the pyridyl and anthracene groups participate in alternating face-to-face π-stacked arrays. Adjacent arrays are held together via $C-H_{pyridine} \cdots \pi_{pyridine}$, $C-H_{pyridine} \cdots \pi_{anthracene}$ and $\pi_{pyridine}-\pi_{anthracene}$ interactions. In contrast to 1, a single pyridyl group is twisted out of the plane of the central anthracene ring, being twisted by $64.5(1)°$. As a consequence of these forces, extended face-to-face stacking of the SBBs is not observed in 1 and 2, the closest centroid-to-centroid distances being 4.05 Å and 7.11 Å, respectively (see FIG. 7).

Having examined the crystal structures of each pure SBB, 1 and 2 were co-crystallized with a resorcinol. Specifically, co-crystals of composition 2(5-methyl-resorcinol)-2(1) (3) and 2(5-iodo-resorcinol)-2(2) (4) were obtained by slow evaporation from $CH_3CN$ and $CHCl_3$/MeOH 5:1 (v:v) solutions, respectively. The formulations of 3 and 4 were confirmed by ¹H NMR spectroscopy and single-crystal X-ray diffraction.

Figure 8:
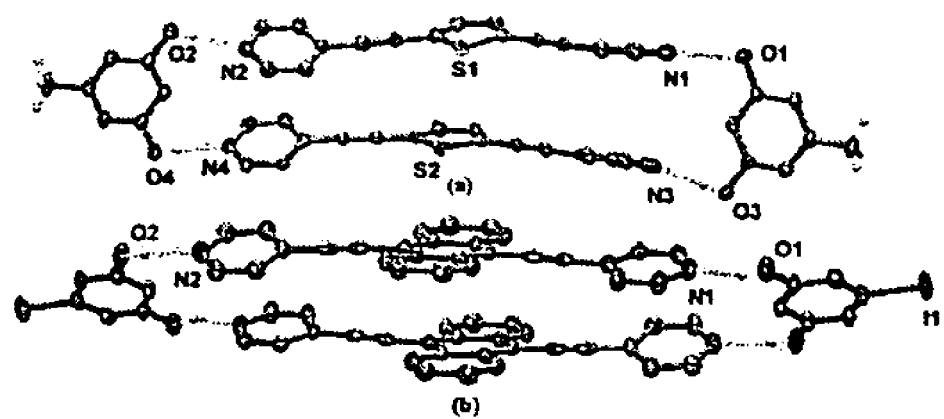
FIG. 8 shows hydrogen-bonded molecular assemblies of: (a) 3 and (b) 4.

The components of each solid assembled to form four-component molecular assemblies held together by four $O-H \cdots N$ hydrogen bonds (FIG. 8). Two complete assemblies and one half of an assembly define the asymmetric units of 3 [O . . . N distances (Å): O1 . . . N1 2.742(5), O2 . . . N2 2.819(5), O3 . . . N4 2.812(5), O4 . . . N4 2.733(5), O5 . . . N5 2.815(6), O6 . . . N6 2.721(5), O7 . . . N7 2.742(6), O8 . . . N8 2.823(5)] and 4 [O . . . N distances (Å): O1 . . . N1 2.735(5), O2 . . . N2 2.782(5)], respectively. The latter sits around a center of inversion. Importantly, the functionalized SBBs of 3 (centroid . . . centroid distances: 3.75 and 3.80 Å) and 4 (centroid . . . centroid distance: 3.78 Å), in contrast to 1 and 2, both participate in face-to-face p-stacking. For 3, the bent thiophene units are oriented parallel (for a discussion on the importance of parallel and antiparallel orientations, see: Bredas, J. L., et al., *J. Proc. Nat. Acad. Sci. USA.* 2002, 99, 5804-5809). To achieve the face-to-face arrangement, the stacked aromatic groups of each functionalized SBB lie approximately co-planar, varying in the angle of the twist with respect to the central ring. For 3 and 4 the twist angles range from $9.6(3)°$ to $32.6(2)°$ and $12.3(2)°$ to $22.0(1)°$, respectively. In 3, the co-planar orientation and twisting of the stacked pyridine and thiophene rings give rise to chiral assemblies that adopt helical conformations, which accounts for the two assemblies being in the asymmetric unit.

Figure 9:
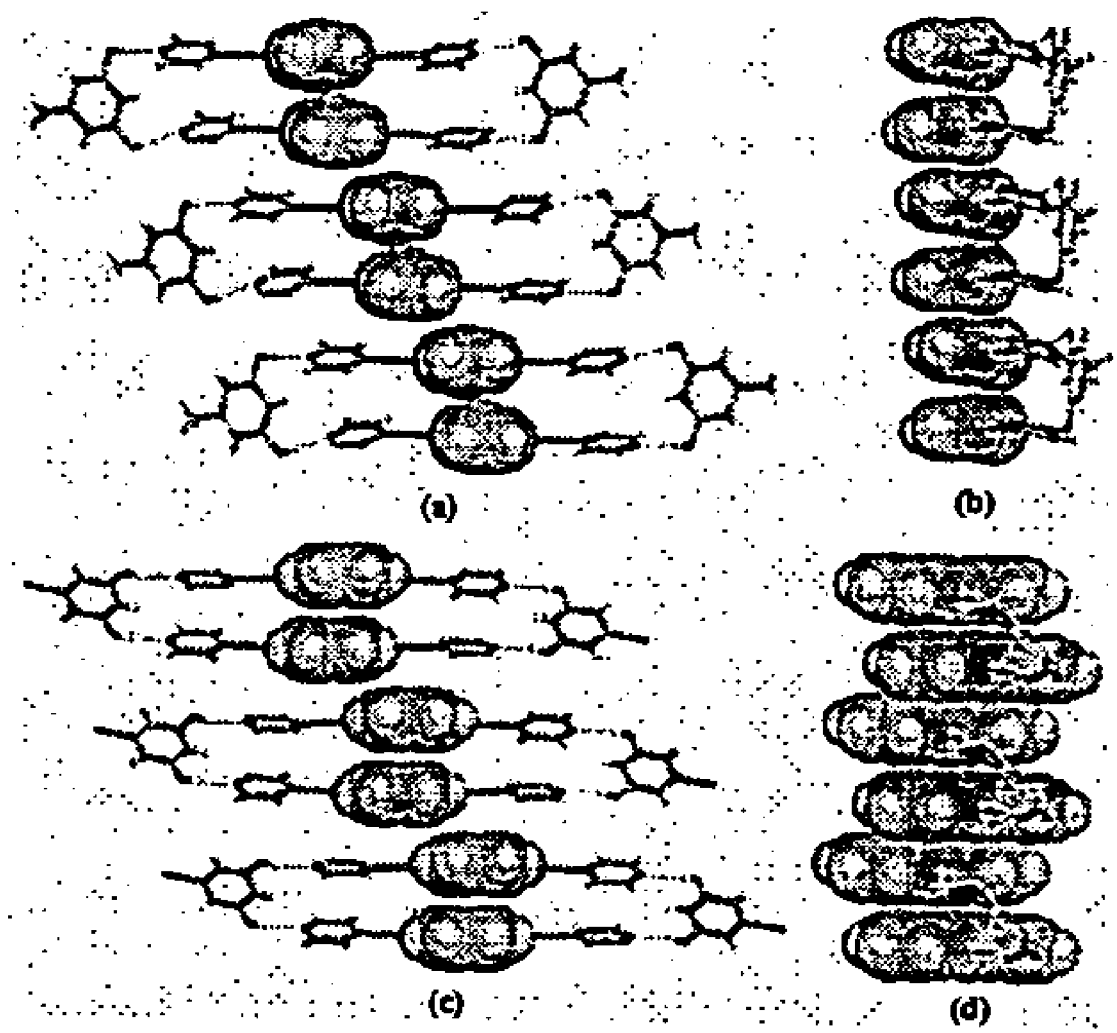
FIG. 9 shows views of face-to-face stacking of 3: (a) perpendicular and (b) along the N-N axis and 4: (c) perpendicular and (d) along the N-N axis.

The co-planar conformations adopted by each functionalized SBB in 3 and 4 have led to extended face-to-face stacking of the SBBs and hydrogen-bonded assemblies in each solid. Specifically, the assemblies of 3 (SBB . . . SBB distances: 3.56 and 3.64 Å) and 4 (SBB . . . SBB distance: 3.44 Å) self-organize in slipped face-to-face arrangements (FIG. 9). The face-to-face geometries can be ascribed to the larger van der Waals surfaces of the molecular assemblies, or supermolecules (see Desiraju, G. R. Angew. *Chem. Int. Ed.* 1995, 34, 2311-2327), which enable each assembly to form an extended π-stacked structure.

Accordingly, a new approach to enforce face-to-face stacking of semiconductor molecules in the solid state has been discovered. Specifically, co-crystals involving SCCFs have been employed to stack SBBs in face-to-face arrangements. The use of SCCFs to stack SBBs can be used to control face-to-face stacking of larger SBBs, as well as SBBs comprising combinations of different aromatic rings. The expected semi-conducting properties of the organic co-crystals will make the materials useful in a host of electrical devices.

Example 1

Preparation of Co-Crystal 3

A closed vial containing 5 mg of 1, 4.2 mg of 5-methylresorcinol, and 1 ml of acetonitrile was heated to reflux and allowed to cool slowly. Subsequent evaporation provided single crystals suitable for X-ray diffraction analysis.

Example 2

Preparation of Co-Crystal 4

A closed vial containing 3 mg of 1, 1.9 mg of 5-iodoresorcinol, and 1 ml of a 5:1 mixture of acetonitrile:methanol was heated to reflux and allowed to cool slowly. Subsequent evaporation provides single crystals suitable for X-ray diffraction analysis.

All publications, patents, and patent documents are incorporated by reference herein, as though individually incorporated by reference. The invention has been described with reference to various specific and preferred embodiments and techniques. However, it should be understood that many variations and modifications may be made while remaining within the spirit and scope of the invention.

What is claimed is:

1. An apparatus comprising: an organic semiconductor co-crystal including a source contact coupled to the organic semiconductor co-crystal, a drain contact coupled to the organic semiconductor co-crystal, and a gate contact coupled to the organic semiconductor co-crystal through an insulative layer, wherein the organic semiconductor co-crystal includes a semiconductor co-crystal former coupled to a semiconductor building block, the semiconductor building block includes an acene, and the semiconductor co-crystal former includes a resorcinol.

2. An apparatus comprising: an electronic circuit; and an organic semiconductor co-crystal switch coupled to the electronic circuit, wherein the organic semiconductor co-crystal switch includes a semiconductor co-crystal former coupled to a semiconductor building block, the electronic circuit includes a digital circuit, and the organic semiconductor co-crystal switch includes an acene and a resorcinol.

3. A semiconducting co-crystal material comprising semiconductor building blocks associated with semiconductor co-crystal formers, wherein the semiconductor building block is 2,5-bis(4-pyridylethynyl)thiophene or 9,10-bis(4-pyridylethynyl)anthracene; and the semiconductor co-crystal former is 5-methylresorcinol or 5-iodoresorcinol.

* * * * *